United States Patent [19]

Bertrand et al.

[11] Patent Number: 5,763,073
[45] Date of Patent: Jun. 9, 1998

US005763073A

[54] ULTRA-THIN LOW MOISTURE CONTENT POLYESTER FILM AND ITS APPLICATIONS

[76] Inventors: Rene Lucien Bertrand, 42 Rue D'Escherange, Angevillers, France, 57440; Klaus Helmut Gabler, 11 Rue Kleischter, Bertrange, Luxembourg, L-8078; Bernard Jean Michels, 15 Ranqwe, Howald, Luxembourg, L-2412; Luc Marie Nicolai, 19 Rue Sonnetty, Arlon, Belgium, L-2412

[21] Appl. No.: 318,745
[22] PCT Filed: Apr. 21, 1993
[86] PCT No.: PCT/US93/03562
   § 371 Date: Sep. 15, 1995
   § 102(e) Date: Sep. 15, 1995
[87] PCT Pub. No.: WO93/22779
   PCT Pub. Date: Nov. 11, 1993

[30] Foreign Application Priority Data

Apr. 23, 1992 [FR] France ............... 92 04995

[51] Int. Cl.$^6$ ............ B32B 15/08; B32B 27/36; C23C 14/02; C23C 14/24
[52] U.S. Cl. ............ 428/338; 428/458; 428/480; 427/81; 427/124; 427/250; 427/296; 427/316; 427/541
[58] Field of Search ............ 428/35.8, 458, 428/480, 910, 694 T, 694 TR, 694 ST, 694 SL, 338; 427/314, 316, 79, 123, 124, 125, 541, 250, 81, 296

[56] References Cited

U.S. PATENT DOCUMENTS

| 4,708,905 | 11/1987 | Yoshii et al. ............ 428/216 |
| 4,756,064 | 7/1988 | Yoshii et al. ............ 29/25.42 |
| 4,814,221 | 3/1989 | Utsumi ............ 428/220 |

FOREIGN PATENT DOCUMENTS

| 55-037318 | 3/1980 | Japan . |
| 60-177426 | 9/1985 | Japan . |
| 60-45056 | 10/1985 | Japan . |
| 63-125327 | 5/1988 | Japan . |
| 04-27524 | 1/1992 | Japan . |

*Primary Examiner*—Vivian Chen

[57] ABSTRACT

A roll of film consists of polyester film having a film thickness of less than 2 μm and having a water content of less than 0.06 weight percent, based on the weight of polyester. The roll of polyester film is suitable for vacuum metallization.

14 Claims, No Drawings

ULTRA-THIN LOW MOISTURE CONTENT POLYESTER FILM AND ITS APPLICATIONS

BACKGROUND OF THE INVENTION

This application is a 371 of PCT/US93/03562, filed Apr. 21, 1993.

The present invention relates to an ultra-thin low moisture content or substantially dry polyester film. It also relates to the applications of such a film and a method of processing during which outgassing takes place, and notably a metallization process, and finally, it relates to metallized films and multi-layer capacitors obtained from such film.

Polyester films, for example, in polyethylene terephthalate (PET) such as Mylar® (DuPont), or in polyethylene naphthalate (PEN) such as those produced by Teijin, are known, along with their applications. Such applications include the use of these polyester films as dielectric material in multi-layer capicators where their use has increased considerably. In such capacitors, a film of metal deposited on the polyester acts as the foil of the capacitor.

There are a very large number of manufacturing processes available. The common link between them is that they involve a step carried out under vacuum in which the virgin polyester film introduced in roll form is unwound, metallized and then wound again onto another core.

In the majority of present-day processes, narrow strips are masked during this metallization step carried out under vacuum, in order to define non-conducting regions referred to as free margins.

The roll of metallized film obtained can then, generally speaking, be treated in two different ways which, this time, are not done under vacuum. A first of such processes consists of unwinding the metallized film, slitting it in the middle of the free margins and then rewinding it in the form of flat rolls referred to as pancakes. Such pancakes are then, in their turn, unwound once again enabling either wound capacitors or what are commonly known as stack capacitors, to be obtained.

A second process consists in unwinding the film which, in this case, is generally metallized on both sides, then covering it with an insulating varnish on one side and then rewinding it onto a drum. Stack capacitors can then be obtained by slitting or guillotining the stack at the middle of the free margins and in the perpendicular direction as well.

The electrical capacity, expressed in Farads, of a multi-layer capacitor is, for a given volume, inversely proportional to the square of the polyester film thickness. This is the reason why there is a heavy demand for ultra-thin film which enable ever-increasing miniaturization to be achieved. There are currently available on the market films which can be as thin as 0.6 microns, and which typically are of the order of one micron thick. Polyester films having a thickness of around 1 micron are however poorly adapted to being treated under vacuum, in a metallizing station, unlike films which are thicker.

It has in fact been noted, somewhat surprisingly, that during unwinding under vacuum, the outer turns of the roll behave in a particular way: they are able to shift sideways with respect to each other in the direction of the axis of the roll causing an offset between layers; this is known as telescoping; the film also suffers from a tendency to "swim", i.e., oscillate laterally about the offset position and, finally, the film tends to expand radially and form wrinkles running in the direction of travel. By way of illustration, four rolls of film 0.9 micron thick and 500 mm wide were observed to suffer from telescoping by an amount of from 1 to 30 mm, from "swimming" with an amplitude of 1 to 10 mm and from formation of wrinkles of a size of from 0.5 to 5 mm.

This behavior with instability and formation of wrinkles is encountered again and/or made more pronounced when the film passes over the transport rolls and over the metallization drum. There are several harmful consequences of such behavior.

Firstly, the roll of metallized film obtained at the end of the process includes wrinkles. Moreover, the turns do not strictly lie one on top of the other but rather are offset axially. Then at the time of slitting, which as has been said, is not done under vacuum, it can obviously be seen that there is a danger of the metallized parts being damaged as a result of the slitting knives coming into contact with them, inevitably leading to reject capacitors. For this reason, the free margins are currently limited to a width of 0.4 mm. Nevertheless, if very low yields are accepted, it is possible to provide free margins of 0.25 mm.

A second harmful consequence is that frequent breakages can occur as the instability is so high. When breakage does occur, it is necessary to re-initialize the metallizer, which is a costly and difficult operation.

A third consequence is that the speed of advancement of the film must be limited to relatively low values so as not to increase the risk of breakage and offset too much. For a thickness of the order of 1 micron, the speed employed is of the order of 1 to 2 meters per second, which could be increased to a figure of 5 meters per second at least if there were no instability, like for conventional thin films of several microns thickness.

The present invention surprisingly makes it possible to overcome all these problems.

SUMMARY OF THE INVENTION

More precisely, the present invention provides an ultra-thin polyester film of a thickness less than or equal to 3 μm in which the weakly bound water content is lower than 0.06 weight % based on the weight of polyester, said water content being calculated at a temperature of 23° C. and for a ratio of $\sigma/Rmax$ of $10^8$ $N.m^{-3}$ where $\sigma$ is the unwinding tension and Rmax is the maximum roll radius when the film is provided in roll form. The weakly bound water considered is the water that is not adsorbed but is fully absorbed, this taking place not in the cavities but uniformly, in the body of the polyester. In fact, each water molecule interacts very little with neighboring water molecules and with the polymer chains. The following publication provides detailed information on this type of bonding: "FTIR study on the nature of water sorbed in polyethylene terephthalate film", Polymer, 1990, Vol. 31, February issue.

The polyester, which is the material of which the present films are made, can be any polyester conventionally used in ultra-thin films. Excellent results have been obtained however with two particular polyesters.

In one embodiment, the polyester is polyethylene terephthalate (PET).

In another embodiment, the polyester is polyethylene naphthalate (PEN).

The thickness of the films according to the present invention is less than or equal to 3 microns, preferably less than 2 μm, and advantageously comprised between 0.4 and 1.4 μm.

The water content of the films according to the present invention expressed in percentage by weight on the basis of the polyester weight is less than 0.06% and, preferably, less than the thickness of the film expressed in microns multiplied by 0.018.

By way of example: For a thickness of 3 microns, the water content is preferably less than 0.054%. For a thickness of 1 micron, the water content is preferably less than 0.018%. For a thickness of 0.5 microns, the water content is preferably less than 0.009%.

The films of the present invention are able to undergo treatment, for example metallization under vacuum, in a ready and fast manner. Thus, speeds can be increased up to 5 to 6 m.s$^{-1}$, and the stability of the film is such that the width of the free margins which initially was 0.4 mm, can be reduced down to 0.1 mm. The films according to the present invention are suitable for use as a dielectric film substrate designed to be metallized either on one or both of its sides with aluminum, zinc, Al/Zn alloy, and other substances. The vacuum used for metallization is variable and is a function of the metal that is to be deposited.

The expression "metallized film" hence covers metallization under vacuum in the wide sense commonly employed by those skilled in the art and is not to be considered as being limited to the metallized films discussed in the example.

The present invention also provides films metallized under vacuum obtained starting from the ultra-thin dry films according to the present invention.

Without wishing to be tied down to any theory, it is believed that the present films obtain their properties thanks to the weakly bound water content, the amount and absorbtion/desorbtion dynamics of which have been neglected to date. Effectively, it is the outgassing of the water contained in the ultra-thin film brought about by the treatment under vacuum which leads to film behaving in a particular way, in other words telescoping, swimming and wrinkling.

Let us consider the case of a conventional polyester film, of a thickness of less than or equal to 3 microns. If this film is kept in air or any other gaseous mixture, the amount of water absorbed is a function of the water vapor partial pressure acting on the film. If this partial pressure is reduced, the film desorbs water automatically until a new equilibrium is reached.

In a temperate climate, the relative humidity of the surrounding air brought, for example, to a temperature of 23° C. is generally comprised between 25 and 50%, corresponding to a water vapor partial pressure comprised between 7 and 14 mbar or, stated differently, 7.10$^2$ to 14.10$^2$ N.m$^{-2}$. For 7 mbar, the water content of the polyester film considered will hence be around 0.125% while, for 14 mbar, this figure will be 0.25%. This linear relation between water content of a polyester film and water partial pressure at 23° C. is known and can readily be verified experimentally. It depends neither on the polyester (PET or PEN) nor on the thickness of the film, but is a function of temperature. The temperature is given here as T=23° C.

Let us now consider that this conventional film, of a thickness less than or equal to 3 microns, in the form of a roll, is introduced into a metallizer and then positioned and subjected to mechanical tensioning. Following this, an air vacuum of 10$^{-2}$ to 10$^{-4}$ mbar, for example, is provided and after this, the film is driven at a speed of 1 to 2 meters per second, such conditions being those in fact actually used. The total pressure acting on the outer turn of the roll is the pressure prevailing in the metallizer, which, for example, is 10$^{-2}$ to 10$^{-4}$ mbar, in other words a pressure that is practically zero. The pressure acting on the other turns is given by the formula:

$$Pn \cong \frac{n\sigma e}{R} + Po$$

in which:

n is the number of the turn, turn 0 being the outermost one of the roll, turn 1 being the one immediately below it, and so on;

Pn is the pressure exercised on turn n by the (n−1) turns outside it (in N.m$^{-2}$) Po being the pressure prevailing in the metallizer;

σ is the specific unwinding tension (in N.m$^{-2}$), this being a parameter of the unwinding process;

e=thickness (expressed in meters);

R=radius of the roll (expressed in meters).

Conventionally, these values have the following order of magnitude:

σ is of the order of 2 kilograms-force per square millimeter, in other words 2.10$^7$ Newton/m$^2$.

R is generally comprised between 0.20 m (maximum radius at start of unwinding) and 0.08 m (at the end).

By applying the above formula to a 1 micron film, we obtain:

P1=1 mbar at the start of unwinding

=2 mbar at the end of unwinding

P5=5 mbar at the start of unwinding

P10=10 mbar at the start of unwinding.

For a 3 micron film, we obtain:

P1=3 mbar at the start of unwinding

=7 mbar at the end of unwinding

P3=9 mbar at the start of the unwinding, etc.

It will thus be seen that when dealing with a roll of conventional polyester film of thickness less than or equal to 3 microns, and being unwound in a metallizer at a given temperature T, there will always be at least one turn on which there will act a total pressure that is less than or approximately equal to the water vapor partial pressure with which the film was in equilibrium at the same temperature T prior to being put under vacuum and which, as described earlier, is of the order of 7 to 14 mbar for 23° C. Moreover, the speed of absorbtion and desorbtion is, in the case of ultra-thin films, extremely fast, in other words of the order of 1 second, unlike films which are several microns thick for which this constant easily reaches a value of the order of 1 minute. Hence, taking account of the speed of advancement, the length of film characteristically used with this apparatus and the very fast absorbtion/desorbtion, the film undergoes outgassing. Outgassing is always present, at least between the two layers that are outermost. Those layers between which, in this way, a sort of water vapor cushion is set up, are then free to relax and move axially one with respect to the other. Unwinding then becomes unstable.

This phenomenon is all the more important as the speed of outgassing becomes very fast. By way of example, tests have shown that the water content of a PET film 1.2 microns thick changes from 0.25 to 0.02% after being exposed to a water vapor partial pressure of 1 mbar for 1.5 seconds.

The present invention is hence based on the discovery that the problem that needed to be tackled by those skilled in the art is the outgassing of the weakly bound water, this problem not having been appreciated in its full importance to date.

A polyester film of thickness less than or equal to 3 microns will not give rise to stable unwinding under vacuum in a metallizer at a given temperature T unless the water vapor pressure with which the film is in equilibrium prior to being put under vacuum, and at the same temperature T, is preferably less than the minimum value of the expression nσe/R for the first turn (n=1), in other words σe/R max. In the present case, σ/Rmax=$10^8$ N.m$^{-3}$. Hence, if e is expressed in microns, we now have the pressure directly in mbar by simply reading e. For a thickness of 0.5 microns, the water vapor partial pressure with which the film is in equilibrium should hence be preferably less than 0.5 mbar. Also, for one micron, 1 mbar is preferably needed and, for 3 microns, 3 mbar respectively.

If we consider a temperature of 23° C. and a ratio σ/Rmax of $10^8$ N.m$^{-3}$ the water vapor partial pressures at equilibrium are converted into water content in line with the linear relation given above (for which 14 mbar corresponds to 0.25% of water content in the film), we obtain:

for a thickness of 0.5 micron, the water content should preferably be less then 0.5×0.25:14, in other words 0.009%, for a thickness of 1 micron, it should preferably be less than 0.018%, for a thickness of 3 microns, it should preferably be less than 0.054%

Generally speaking, the water content, expressed as a percentage by weight, should be preferably less than the thickness of the film expressed in microns multiplied by the number 0.018 (0.25 divided by 14).

In the present specification and claims, the water content is expressed as a weight percentage involving calculation based on defined operating conditions. These conditions are a temperature of 23° C. and a ratio σ/Rmax of $10^3$ N.m$^{-3}$. Those skilled in the art will readily appreciate that the water content will vary as these parameters vary; nevertheless it is possible to find any equivalent water content value for the above specified values of σ/Rmax and temperature when a water content measured under different operating conditions is available.

Polyester films of thickness less than 3 microns, that fulfill this condition, will no longer be subject to instability on the transport and tensioning rolls nor on the metallizing drum.

Effectively, in this case, the total pressure acting on the film and the roll is given by the relation:

$P = \sigma e / R$ where R, now, is the radius of the roll.

This pressure is lowest in the case where the metallizing drum has the largest radius. Now, this radius is precisely of the order of the maximum radius that we considered for unwinding, in other words 0.2 meters. Consequently, the films according to this invention, which do not outgas during unwinding, will also not outgas now when passing over the drum.

The outgassing phenomenon which has been highlighted has consequences in other areas apart from metallization under vacuum, this latter being the field in which the technical problem occurred for the first time during unwinding of films to be metallized. It does not only happen under vacuum; at high temperatures, the weakly bound water evaporates and the vaporization dynamics are similar to those obtaining for vacuum conditions. Particularly, in those processes that require mono- or bi-axial stretching, such stretching takes place at a temperature higher than the glass transition temperature Tg of the film and leads to outgassing, in a similar way to the outgassing that happens during metallization under vacuum. The problem that has been discovered is in fact present in all processes that involve an outgassing step. The water contents are then given by relations that are similar to those listed above.

The expression "process involving an outgassing step" means a process in which: firstly, the operating conditions lead to rapid desorbtion, in other words with dynamics involving a speed of several seconds, of weakly bound water present in the polyester film; and secondly, the characteristic process time of the machine in which this process is implemented is also of the order of a few seconds to allow outgassing. Typically, this process or treatment is implemented in production equipment using a length of around one meter and a speed of advancement of around one meter per second.

Thus, the present invention relates to the use of the present films in treatment processes during which an outgassing stage takes place. Preferably, such processes consist of metallization under vacuum, as described previously. Nevertheless, any treatment involving coating is also envisaged: for example, the coating of polyester films with a magnetic material for the manufacture of video or audio tapes.

The present invention also provides films treated as described above, in particular metallized films obtained from film according to the present invention.

The film can be brought to this state of dryness, i.e., 0.06% by weight or less, by any suitable method. Such a method can consist of carrying out manufacture and winding under vacuum, followed by an unwinding-rewinding step under vacuum or at elevated temperature or yet again in a particularly anhydrous atmosphere. Any drying process that leads to outgassing is in fact appropriate. The present invention hence also relates to a process employing a polyester film where an outgassing step is included, further including a pre-drying step until a weakly bound water content is obtained that is less than 0.06% by weight calculated for the above specified operating condition values of a/Rmax and temperature. Particularly, the present invention relates to films in accordance with the invention in a packaging in which the prevailing atmosphere has a water vapor partial pressure value which is in equilibrium with the film.

The water content is measured as follows: from a roll, a series of rectangular pieces of size 2¼"×2½" (5.72 cm×6.55 cm) are cut, which are stacked one on top of the other so as to constitute samples each weighing about 100 g. These samples are weighed very accurately 30 seconds after obtaining them. They are then subjected to high vacuum at a pressure less than 10 atmospheres for at least 90 hours, and are then weighed again immediately after such treatment under vacuum; the relative weight difference is then less than 0.06%.

ILLUSTRATIVE EXAMPLE

A PET film 0.9 μm thick and 500 mm wide was rewound onto a dry core in air at 23° C. at a relative humidity of less than 2.9%. The speed the film moved at provided a sufficiently long exposure time to allow the film to outgas. The windup equipment included a lay-on roller in order to limit the quantity of air in the roll.

Under these conditions, the film's water content was of the order of 0.0145% and the problems normally encountered during metallization under vacuum did not appear.

In order to keep the film in its dry state, is was stored as follows. The roll was fitted onto two dry holders. A desiccating medium, such as silica gel or alumina ($Al_2O_3$) was placed in the two holders as well as at the center of the roll. The roll was wrapped in a film impermeable to water vapor such as a PET-Al-PE film (9 μm, 12 μm, 30 μm) after which it was sealed hermetically.

The amount of desiccant introduced into the packaging should be such that the water vapor partial pressure with which the film is in equilibrium is maintained despite the permeability of the packing.

During metallization under vacuum, the PET film, which was 0.9 μm thick, behaved as follows:

during unwinding, the virgin film maintained its smooth mirror-like appearance and the surface layers neither telescoped nor showed a tendency to "swim";

the film did not slide sideways or wrinkle on the transfer rolls;

increasing the speed of the film did not affect stability which was still perfect even at 5 m.s$^{-1}$.

Thus the present invention makes it possible:

to significantly improve the stability of free margin superpositioning on the roll of film produced leading to higher production yields since capacitors can only be made from rolls where the free margins lie correctly on top of each other and without creases;

to decrease the width of the free margin down to a value of 0.1 mm enabling capacitors of an even greater degree of miniaturisation to be manufactured;

to increase metallization speed and hence output;

to make metallization possible on thicknesses of sub-micron size.

The present invention is obviously not limited to the embodiments described and discussed but may be subject to numerous variations available to those skilled in the art without this leading to departure from the scope of the invention.

What is claimed is:

1. A roll of film consisting of polyester film having a film thickness of less than 2 microns, characterized in that its bound water content is lower than 0.06 weight %, based on the weight of polyester, said water content being calculated at a temperature of 23° C. and for a ratio σ/Rmax of 10$^8$ N.m$^{-3}$ where σ is the unwinding tension and Rmax is the maximum roll radius.

2. The roll of film of claim 1 wherein the water content, expressed in weight percent, is less than 0.018 times the value of the film thickness expressed in microns.

3. The roll of film of claim 1 wherein the film thickness is between 0.4 to 1.4 microns.

4. The roll of film of claim 1 wherein the polyester is polyethylene terephthalate.

5. The roll of film of claim 1 wherein the polyester is polyethylene naphthalate.

6. The roll of film of claim 1 wherein the film thickness is 1 micron and the water content is less than 0.018 weight %.

7. The roll of film of claim 1 wherein the film thickness is 0.5 microns and the water content is less than 0.009 weight %.

8. A process of treating and vacuum metallizing a roll of polyester film comprising the steps of:

(a) reducing bound water content of polyester film having a film thickness of less than 2 microns to lower than 0.06 weight %, based on the weight of polyester, said water content being calculated at a temperature of 23° C. and for a ratio σ/Rmax of 10$^8$ N.m$^{-3}$ where σ is the unwinding tension and Rmax is the maximum roll radius when the film is provided in roll form;

(b) providing the polyester film in a roll consisting of said film; and (c) vacuum metallizing the polyester film from said roll.

9. The process of claim 8 wherein the film has a water content, expressed in weight percent, of less than 0.018 times the value of film thickness expressed in microns.

10. The process of claim 8 wherein the film thickness is between 0.4 to 1.4 microns.

11. The process of claim 8 wherein the polyester is polyethylene terephthalate.

12. The process of claim 8 wherein the polyester is polyethylene naphthalate.

13. The process of claim 8 wherein the film thickness is 1 micron and the water content is less than 0.018 weight percent.

14. The process of claim 8 wherein the film thickness is 0.5 microns and the water content is less than 0.009 weight %.

* * * * *